United States Patent
Yang et al.

(10) Patent No.: US 7,341,488 B2
(45) Date of Patent: Mar. 11, 2008

(54) EMI-RESISTANT CIRCUIT BOARD ASSEMBLY

(75) Inventors: Bor-Ching Yang, Taipei (TW);
Ping-Hui Chen, Taoyuan County (TW);
Jui-Chuan Huang, Taipei County (TW)

(73) Assignee: Askey Computer Corp., Taipei (TW)

( * ) Notice: Subject to any disclaimer, the term of this patent is extended or adjusted under 35 U.S.C. 154(b) by 0 days.

(21) Appl. No.: 11/515,772

(22) Filed: Sep. 6, 2006

(65) Prior Publication Data

US 2007/0178763 A1   Aug. 2, 2007

(30) Foreign Application Priority Data

Jan. 27, 2006   (TW) ............................... 95202090 U (51) Int. Cl.
*H01R 13/648* (2006.01)
(52) U.S. Cl. .................. 439/607; 439/620; 439/541.5; 361/790
(58) Field of Classification Search ........ 439/607–608, 439/620, 541.5; 361/790
See application file for complete search history.

(56) References Cited

U.S. PATENT DOCUMENTS

| | | | | |
|---|---|---|---|---|
| 5,013,249 | A * | 5/1991 | Lindeman et al. | 439/66 |
| 5,575,686 | A * | 11/1996 | Noschese | 439/620.21 |
| 5,677,830 | A * | 10/1997 | Nogas et al. | 361/790 |
| 5,768,106 | A * | 6/1998 | Ichimura | 361/785 |
| 5,956,835 | A * | 9/1999 | Aksu | 29/468 |
| 6,558,191 | B2 * | 5/2003 | Bright et al. | 439/541.5 |
| 6,583,677 | B2 * | 6/2003 | Shintani et al. | 331/107 SL |
| 7,085,142 | B2 * | 8/2006 | Berberich | 361/818 |

* cited by examiner

*Primary Examiner*—Truc Nguyen
(74) *Attorney, Agent, or Firm*—Browdy and Neimark, PLLC (57) ABSTRACT

An EMI-resistant circuit board assembly includes a plurality of circuit boards arranged in a stack and a metal shielding frame respectively sandwiched in between each two adjacent circuit boards. One of the circuit boards has at least one high-speed device producing high-frequency noises to the ambient, which result in EMI effect. The metal shielding frame is electrically connected to the ground potential of the circuit boards and shields the high-speed device on the circuit board to guide the high-frequency noises to the ground potential.

11 Claims, 7 Drawing Sheets

EMI-RESISTANT CIRCUIT BOARD ASSEMBLY

BACKGROUND OF THE INVENTION

1. Field of the Invention

The present invention relates to circuit boards and more particularly, to an EMI-resistant circuit board assembly, which prevents the characteristics of devices and circuits from interference by the electromagnetic wave of high-frequency noises.

2. Description of the Related Art

The arrangement of electronic devices on a circuit board must be determined subject to the function of the electronic circuit and must consider electric coupling or electromagnetic interference among devices. For example, the high-speed digital processor or control switch of an electronic circuit or the antenna of a high-frequency circuit produces high-frequency electromagnetic waves under a high speed or high frequency operation environment. The high-frequency noises will more or less interfere with the transmission of analogue audio or video signal, thereby affecting signal transmission performance. Therefore, the circuit layout of a circuit board must consider the function of electromagnetic interference (EMI) resistance.

Figure 1:
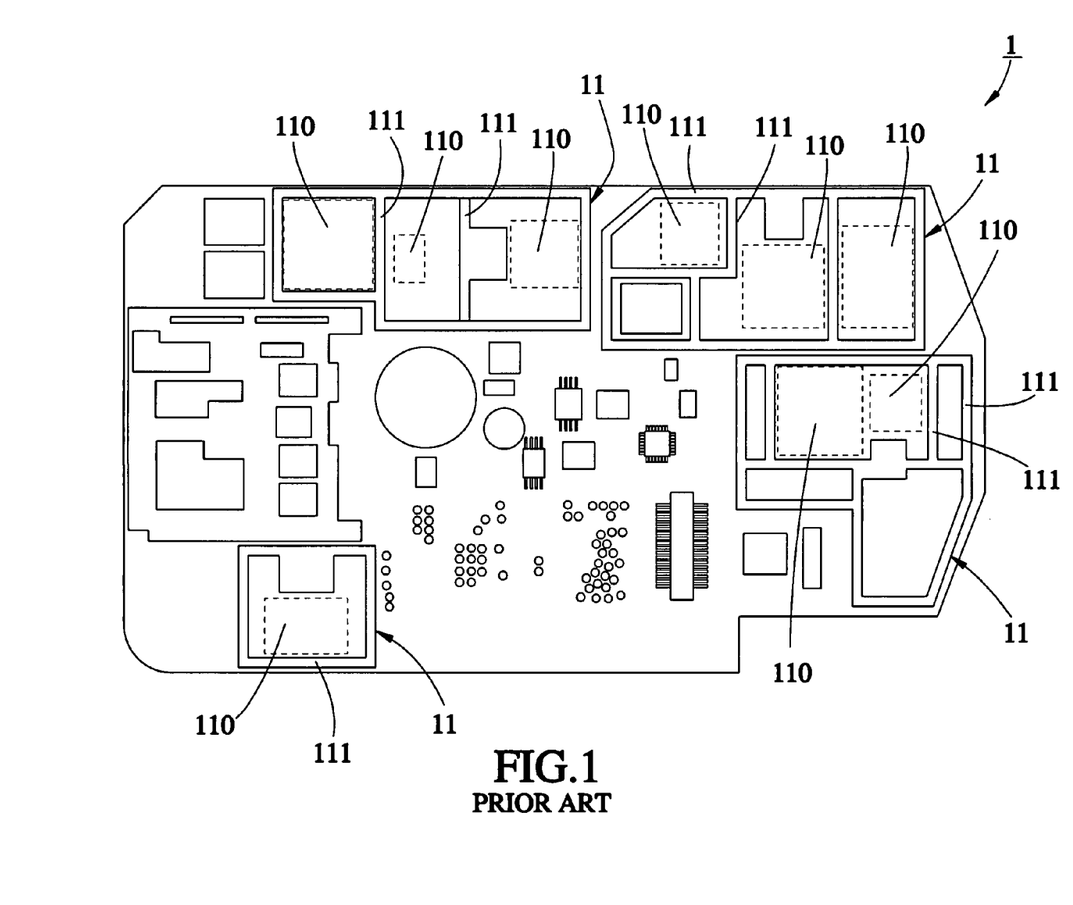
FIG. 1 is a schematic drawing showing the structure of an EMI-resistant circuit board according to the prior art.
Figure 2:
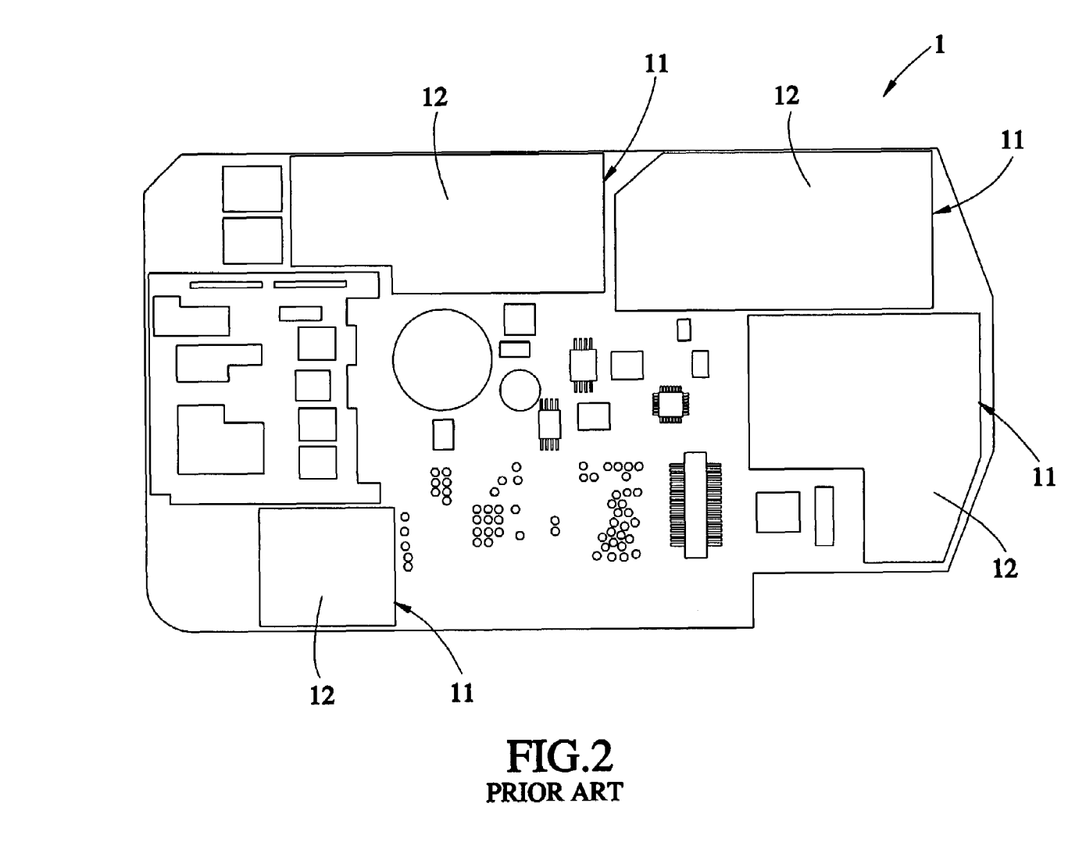
FIG. 2 is another schematic drawing of the EMI-resistant circuit board according to the prior art, showing that metal shielding masks are covered on the high-frequency circuit regions respectively.

FIGS. 1 and 2 illustrate an EMI-resistant circuit board 1 according to the prior art. According to this design, the EMI-resistant circuit board 1 comprises a plurality of high-frequency circuit regions 11. Each high-frequency circuit region 11 is comprised of a plurality of electronic devices 110 that produce high-frequency noises during operation, and a plurality of metal frames 111 that surround the effective circuit of each of the electronic devices 110 and separate the electronic device 110 from one another. As shown in FIG. 2, a plurality of metal shielding masks 12 are respectively covered on the high-frequency circuit regions 11 and disposed in contact with the metal frames 111 to guide high-frequency noises to the ground potential. Therefore, the high-frequency noises produced in the high-frequency circuit regions 11 are shielded without affecting the electric properties of other devices and circuits, and the metal frames 111 prevent electromagnetic interference among the high-frequency electronic devices 110. However, because the metal shielding masks 12 are respectively configured subject to the configuration of the high-frequency circuit regions 11, the fabrication of the metal shielding boards 12 is complicated and expensive. In case of employing the design to have the high-frequency circuit regions 11 be arranged together, only one single metal shielding mask 12 is necessary to shield the high-frequency circuit regions 11. However, if the borders of the high-frequency regions 11 do not match with one another, the design will waste much circuit space. In this case, the high-frequency regions 11 will occupy much surface area of the circuit board 1. In consequence, the size of final product will be relatively increased, and other circuit function designs must be relatively reduced, thereby degrading the integrity of circuit function of the electronic product.

SUMMARY OF THE INVENTION

The present invention has been accomplished under the circumstances in view. It is the main object of the present invention to provide a simple and low-cost EMI-resistant circuit board assembly that effectively prevents electromagnetic interference, effectively utilizes circuit design space, and reduces the size of final product.

To achieve this object of the present invention, the EMI-resistant circuit board assembly comprises at least two circuit boards arranged in a stack, and a metal shielding frame sandwiched between each two of adjacent circuit boards. Each of the circuit boards has an electronic circuit thereon. The circuit boards include a first circuit board having at least one high-speed device that produces high-frequency noises to the ambient, which result in EMI effect. The metal shielding frame is electrically connected to a ground potential of the circuit boards and shields the at least one high-speed device to guide the produced high-frequency noises to the ground potential.

DETAILED DESCRIPTION OF THE INVENTION

Figure 3:
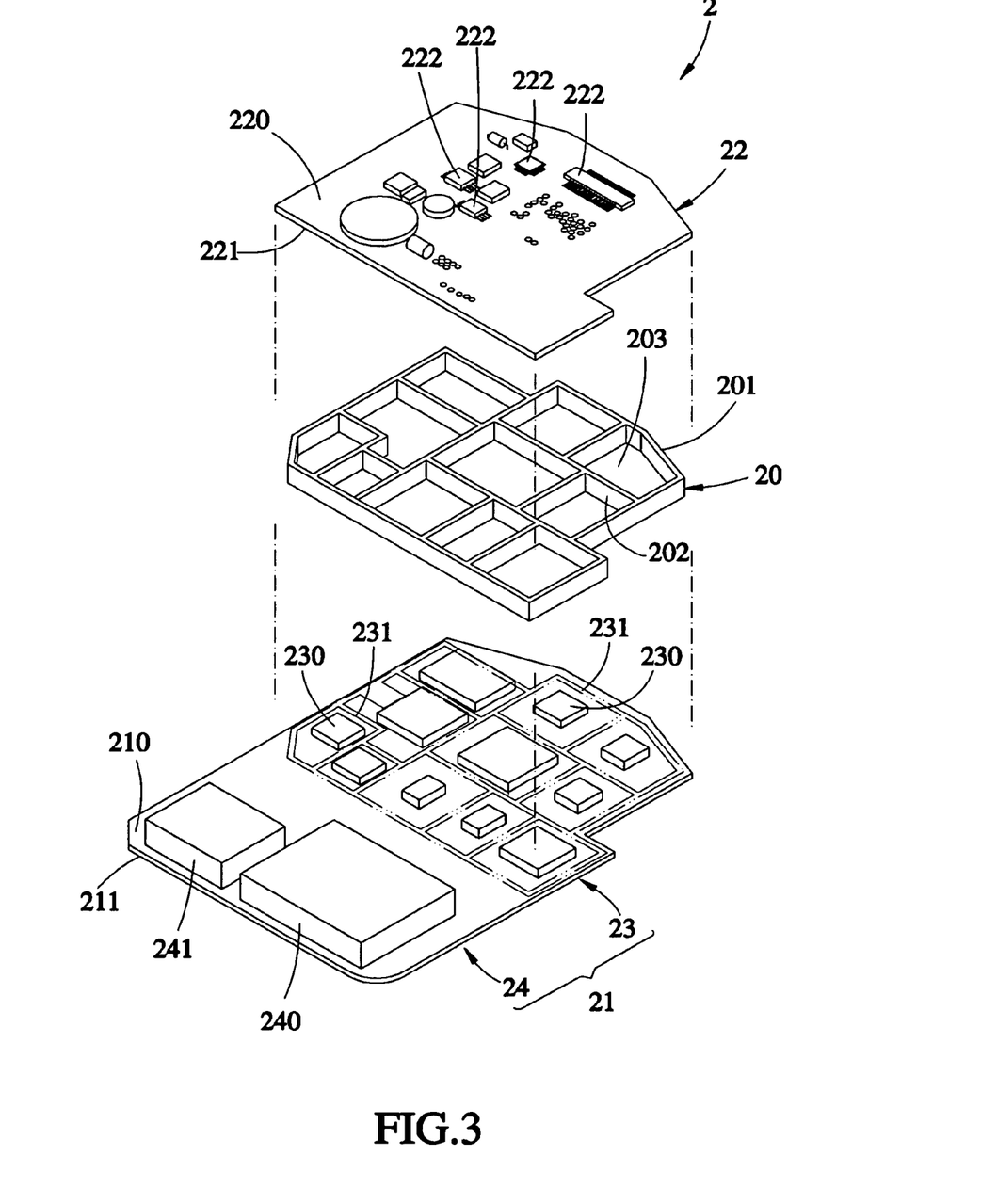
FIG. 3 is an exploded view of an EMI-resistant circuit board assembly in accordance with a first embodiment of the present invention.

Referring to FIG. 3, an EMI-resistant circuit board assembly 2 in accordance with a first embodiment of the present invention is shown comprising a main circuit board 21 disposed at the bottom side, an analog circuit board 22 disposed at the top side, and a metal shielding frame 20 set in between the main circuit board 21 and the analog circuit board 22.

The bottom main circuit board 21 has arranged thereon a high-speed processing circuit. The top analog circuit board 22 has arranged thereon an analog circuit for transmission of analog signal. These two circuit boards 21 and 22 have also arranged thereon a respective digital circuit for transmission of digital signal that is free from EMI. The structures of the circuit boards 21 and 22 and the metal shielding frame 20 and their relative relationship are described hereinafter.

The main circuit board 21 comprises a high-frequency circuit region 23 and a digital circuit region 24. Further, the main circuit board 21 has a top surface 210 and a bottom surface 211. The high-frequency circuit region 23 has a plurality of high-speed devices 230 and a grounding circuit 231 arranged on the top surface 210. The grounding circuit 231 is arranged around the effective circuit of each high-speed device 230. These high-speed devices 230 include such as high-speed processor or signal controller producing high-frequency noises during logic operation or control switching. The digital circuit region 24 is comprised of the aforesaid digital circuit, a power adapter 240 for driving the whole circuit system of the EMI-resistant circuit board assembly 2 and transmission interfaces 241 for digital signal transmission with the peripheral components that are electrically connected to the EMI-resistant circuit board assembly 2.

The metal shielding frame 20 is made of a metal conducting material. Structurally, the metal shielding frame 20 is divided into an outer frame 201 extending around the border and a plurality of division frames 202 corresponding to the grounding circuit 231 around the effective circuit region of each high-speed device 230, thereby defining a plurality of accommodation chambers 203. The outer frame 201 and the division frames 202 have the bottom side bonded to the grounding circuit 231. Therefore, the metal shielding frame 20 is equivalent to the ground potential. The height of the metal shielding frame 20 is slightly greater than the mounting height of all the electronic devices in the high-frequency circuit region 23. The high-speed devices 230 are respectively accommodated in the accommodation chambers 203.

The analog circuit board 22 has a top surface 220 and a bottom surface 221. The top surface 220 has the electronic devices 222 of the aforesaid analog circuit and digital circuit arranged thereon. The bottom surface 221 is electrically connected to the ground potential and bonded to the top side of the outer frame 201 and division frames 202 of the metal shielding frame 20, keeping the metal shielding frame 20 fixedly sandwiched in between the bottom surface 221 of the analog circuit board 22 and the top surface 210 of the main circuit board 21.

The metal shielding frame 20 can be bonded to the two circuit boards 21 and 22 with a conducting bonding agent or through a soldering process. Therefore, the metal shielding frame 20 supports the two circuit boards 21 firmly and encloses the high-speed devices 230 in the accommodation chambers 203, enabling the high-frequency noises produced during high speed operation of the high-speed devices 230 to be guided to the ground potential to prevent leakage of high-frequency noises such that the transmission of analog signal will not be affected by the high-frequency noises. Further, because the EMI-resistant circuit board assembly 2 has the two circuit boards 21 and 22 and the metal shielding frame 20 arranged in a stack, it minimizes the occupation of planar space and greatly increases available circuit layout area, thereby effectively enhancing gain of circuit board layout work.

Figure 4:
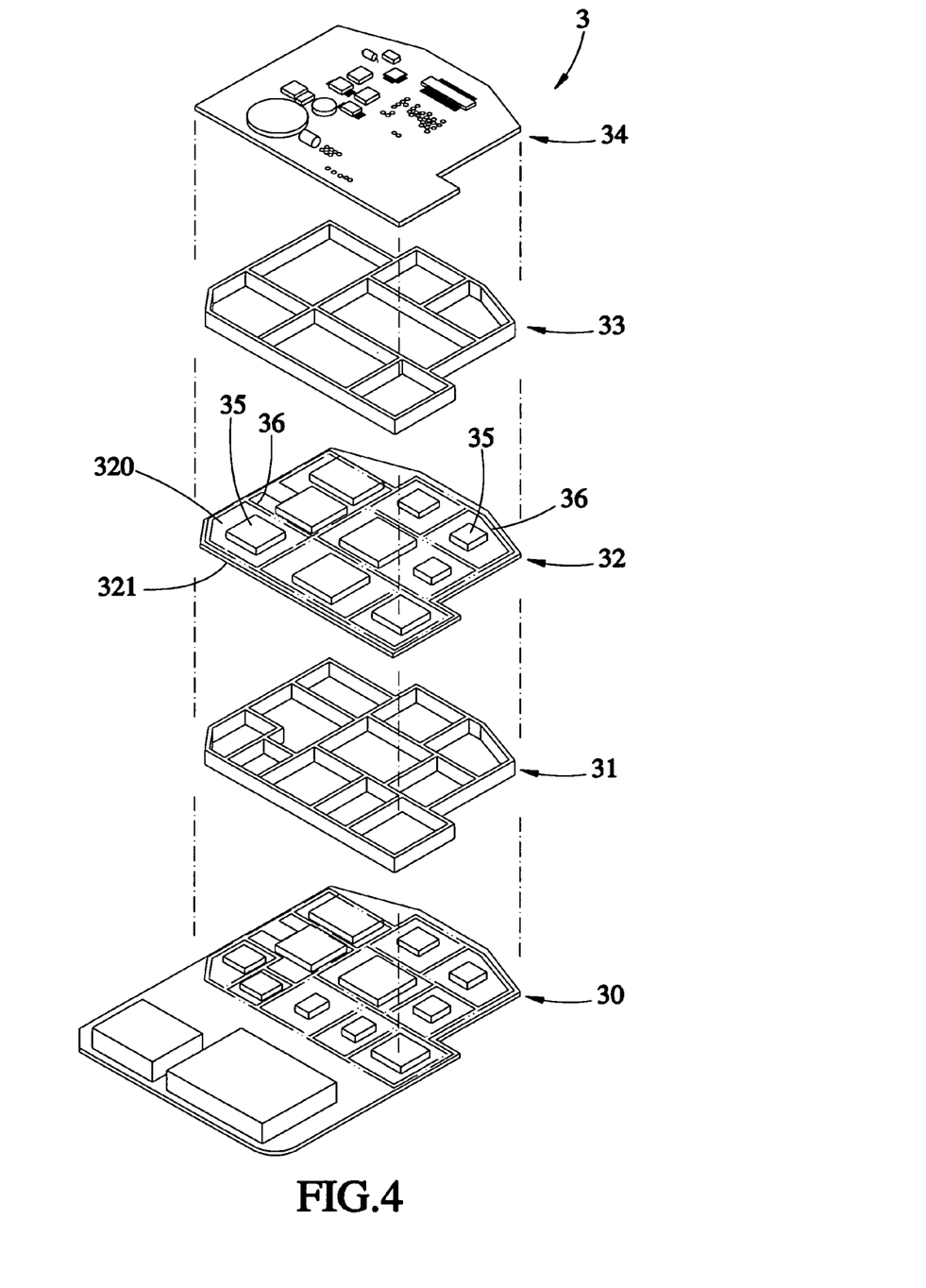
FIG. 4 is an exploded view of an EMI-resistant circuit board assembly in accordance with a second embodiment of the present invention.

When more high-speed devices 230 are necessary in the whole circuit system and the area of the bottom main circuit board 21 is insufficient, the EMI-resistant circuit board assembly can be expanded in vertical direction without extending the area of the main circuit board 21. FIG. 4 shows an EMI-resistant circuit board assembly 3 in accordance with a second embodiment of the present invention. According to this second embodiment, the EMI-resistant circuit board assembly 3 comprises a main circuit board 30, a first metal shielding frame 31, a high-frequency circuit board 32, a second metal shielding frame 33, and an analog circuit board 34 stacked in sequence.

Functionally, the designs of the main circuit board 30, the first metal shielding frame 31 and the analog circuit board 34 are respectively equivalent to the main circuit board 21, metal shielding frame 20 and analog circuit board 22 of the aforesaid first embodiment in functional design.

The high-frequency circuit board 32 has a circuit design similar to the high-frequency circuit region 23 of the main circuit board 21 of the aforesaid first embodiment. The high-frequency circuit board 32 has also a top surface 320 and a bottom surface 321 opposite to the top surface 320. The top surface 320 has a plurality of high-speed devices 35 arranged thereon, and a grounding circuit 36 extending around the effective circuit of each of the high-speed devices 35. Functionally, the structure of the bottom surface 321 is substantially similar to the bottom surface 221 of the analog circuit board 22 of the aforesaid first embodiment, i.e., the bottom surface 321 is electrically connected to the ground potential of the whole circuit system and bonded to the first metal shielding frame 31.

Functionally, the structure of the second metal shielding frame 33 is same as the metal shielding frame 20 of the aforesaid first embodiment. The second metal shielding frame 33 is fixedly sandwiched in between the analog circuit board 34 and the high-frequency circuit board 32, and adapted to guide high-frequency noises produced during operation of the high-frequency devices 322 to the ground potential.

Therefore, simply by means of expanding the necessary circuit space in vertical direction, the EMI-resistant circuit board assembly 3 minimizes product's size and effectively prohibits electromagnetic interference.

Figure 5:
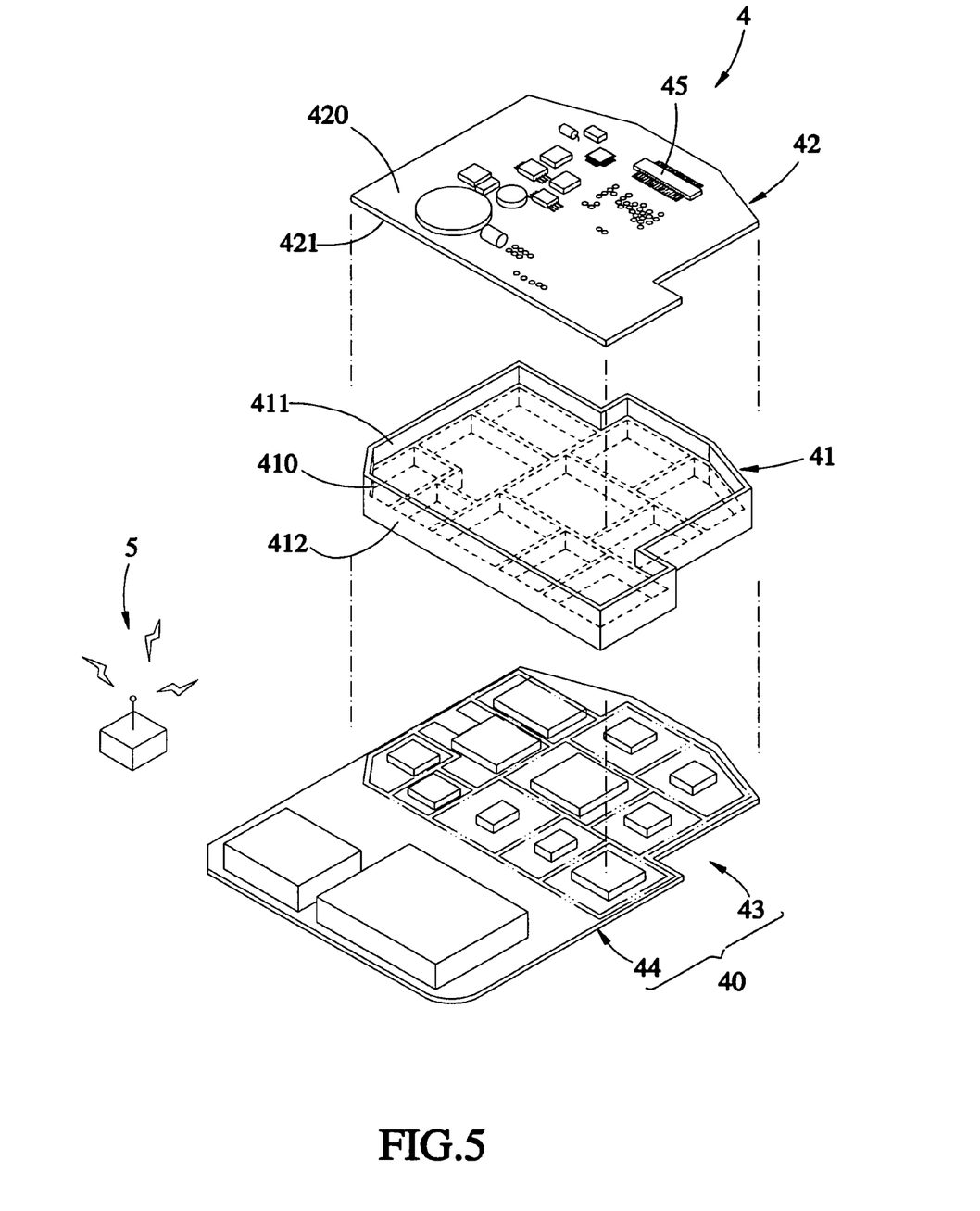
FIG. 5 is an exploded view of an EMI-resistant circuit board assembly in accordance with a third embodiment of the present invention.
Figure 6:
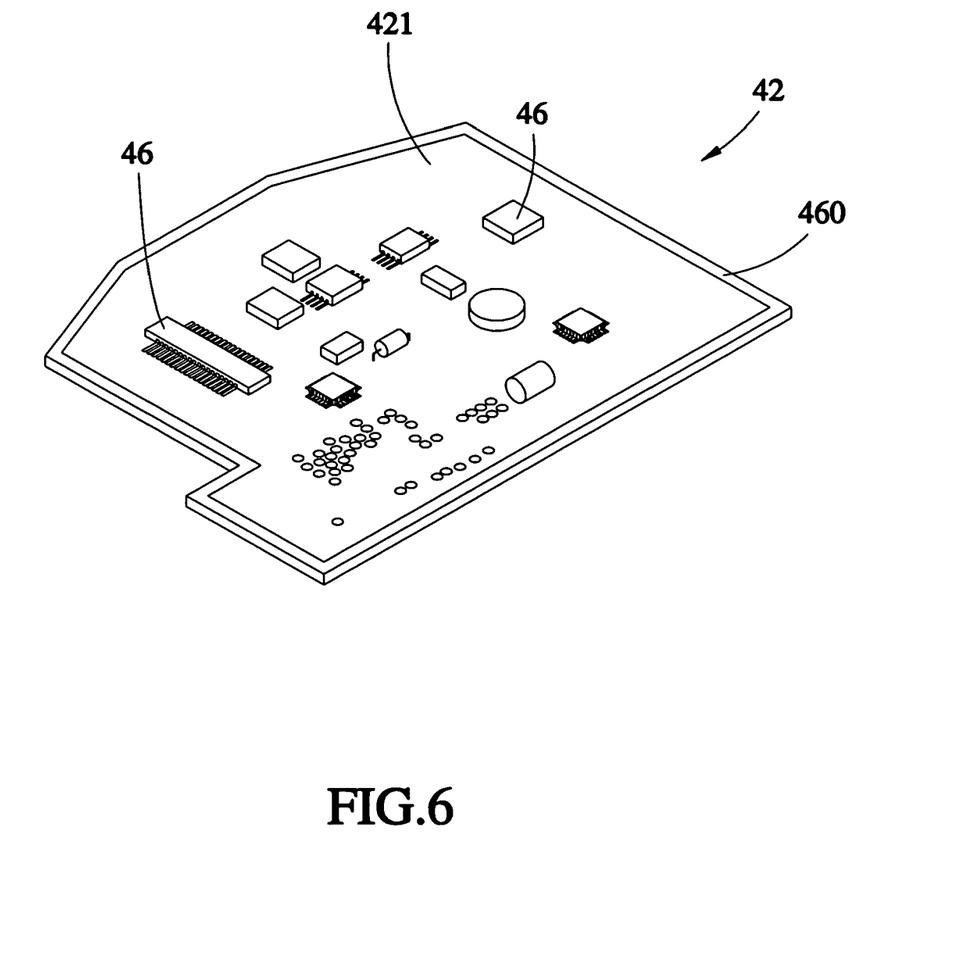
FIG. 6 illustrates the circuit arrangement on the bottom surface of the analog circuit board of the EMI-resistant circuit board assembly according to the third embodiment of the present invention.
Figure 7:
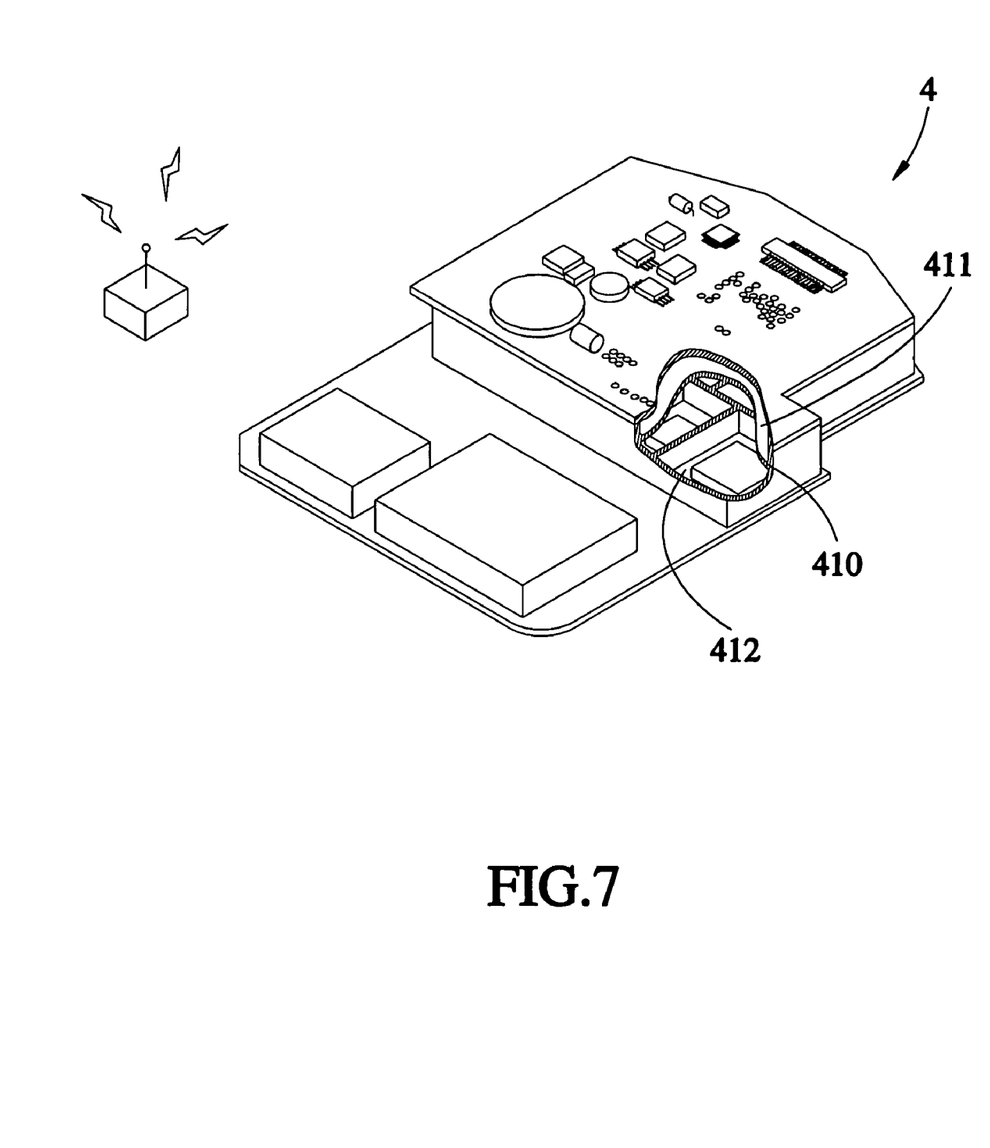
FIG. 7 is a partial cutaway view of the EMI-resistant circuit board assembly according to the third embodiment of the present invention.

Further, when considering ambient EMI effects such as communication noises or ambient electrostatic damage or the necessary installation of an analog signal transmitter/receiver such as an antenna, the invention provides a third embodiment to protect signal transmission of the internal analog circuit against ambient EMI effects. As shown in FIGS. 5-7, the EMI-resistant circuit board assembly 4 according to this third embodiment comprises a main circuit board 40, a metal shielding frame 41, and an analog circuit board 42. The main circuit board 40, the metal shielding frame 41 and the analog circuit board 42 are arranged in a stack.

Similar to the circuit design of the main circuit board 21 of the aforesaid first embodiment, the main circuit board 40 has a high-frequency circuit region 43 and a digital circuit region 44.

The analog circuit board 42 has a top surface 420 and a bottom surface 421. The top surface 420 has mounted thereon electronic devices 45 for transmission of digital signal. Therefore, it is not necessary to consider protection of the top surface 420 against EMI (electromagnetic interference). As shown in FIG. 6, the bottom surface 421 has mounted thereon electronic devices 46 for transmission of analog signal, and a grounding circuit 460 extending around the border.

The metal shielding frame 41 is made of a metal conducting material. The top and bottom edges of the metal shielding frame 41 are configured subject to the grounding circuit 460 of the analog circuit board 42 and the border grounding circuit of the high-frequency circuit region 43, therefore the metal shielding frame 41 is equivalent to ground potential. Further, the metal shielding frame 41 is divided into a top shielding region 411 and a bottom shielding region 412 by a metal partition board 410. As shown in FIG. 7, the bottom shielding region 412 is similar to the division structure of the metal shielding frame 20 of the aforesaid first embodiment. Therefore, high-frequency noises produced during circuit operation of the high-frequency circuit region 43 are guided to the ground potential without leakage. The top shielding region 411 does not have any division structure. However, the height of the top shielding region 411 is greater than the mounting height of all the electronic devices on the bottom surface 421 of the analog circuit board 42 so that the circuits surrounded by the grounding circuit 460 are covered within the top shielding region 411, which provides a satisfactory electrostatic shielding effect against external high-frequency noises produced from a nearby signal transmitting source 5.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An EMI-resistant circuit board assembly comprising:
   at least two circuit boards arranged in a stack and provided respectively with an electronic circuit thereon, the circuit boards including a first circuit board having at least one high-speed device that produces high-frequency noises; and
   a shielding frame made of conductive metal material, sandwiched between each two of the circuit boards and electrically connected to parts of the two circuit boards that are at ground potential; wherein the shielding frame shields the at least one high-speed device for guiding the high-frequency noises to the ground potential.

2. The EMI-resistant circuit board assembly as claimed in claim 1, wherein the circuit boards include a second circuit board located above the first circuit board and provided with an analog circuit thereon for transmission of analog signal.

3. The EMI-resistant circuit board assembly as claimed in claim 2, wherein the second circuit board has a top surface on which a plurality of electronic devices for transmission of the analog signal are provided, and a bottom surface electrically connected to the ground potential.

4. The EMI-resistant circuit board assembly as claimed in claim 2, wherein the first circuit board comprises a high-frequency circuit region on which a plurality of said high-speed devices and a grounding circuit are provided; wherein the grounding circuit surrounds each of the high-speed devices.

5. The EMI-resistant circuit board assembly as claimed in claim 4, wherein the shielding frame comprises an outer frame and a plurality of division frames having configurations corresponding to the grounding circuit; wherein the division frames define with the outer frame a plurality of accommodation chambers that respectively accommodate each of the high-speed devices.

6. The EMI-resistant circuit board assembly as claimed in claim 2, wherein the second circuit board has a top surface on which a plurality of electronic devices for transmission of digital signal are provided, and a bottom surface on which a plurality of electronic devices for transmission of analog signal are provided; wherein the bottom surface of the second circuit board is provided at a peripheral thereof a grounding circuit electrically connected to the ground potential.

7. The EMI-resistant circuit board assembly as claimed in claim 6, wherein the shielding frame comprises a top shielding region, a bottom shielding region and a metal partition board separating the top shielding region and the bottom shielding region; wherein the electronic devices on the bottom surface of the second circuit board are shielded by the top shielding region of the shielding frame, and the at least one high-speed device is shielded by the bottom shielding region of the shielding frame.

8. The EMI-resistant circuit board assembly as claimed in claim 1, wherein the circuit boards include the first circuit board, a second circuit board and a third circuit board, and a first said shielding frame is sandwiched between the first circuit board and the second circuit board and a second said shielding frame is sandwiched between the second circuit board and the third circuit board such that the second circuit board is located above the first circuit board and the third circuit board is located above the second circuit board; wherein the second circuit board is provided at a surface thereof facing the third circuit board with at least one high-speed device and the third circuit board is provided with an analog circuit thereon for transmission of analog signal.

9. The EMI-resistant circuit board assembly as claimed in claim 8, wherein the third circuit board has a top surface on which a plurality of electronic devices for transmission of analog signal are provided, and a bottom surface electrically connected to the ground potential.

10. The EMI-resistant circuit board assembly as claimed in claim 8, wherein the second circuit board has a plurality of said high-speed devices and a grounding circuit surrounding each of the high-speed devices of the second circuit board.

11. The EMI-resistant circuit board assembly as claimed in claim 1, wherein said frame is open at least one end and extends around the at least one high-speed device.

* * * * *